United States Patent

Medelius et al.

[11] Patent Number: 5,977,773
[45] Date of Patent: Nov. 2, 1999

[54] NON-INTRUSIVE IMPEDANCE-BASED CABLE TESTER

[75] Inventors: Pedro J. Medelius, Merritt Island; Howard J. Simpson, Melbourne, both of Fla.

[73] Assignee: The United States of America as represented by the Administrator of the National Aeronautics and Space Administration, Washington, D.C.

[21] Appl. No.: 08/912,035

[22] Filed: Aug. 15, 1997

[51] Int. Cl.⁶ ............................................. G01R 31/08
[52] U.S. Cl. .......................................................... 324/520
[58] Field of Search ............................ 324/520, 521, 324/522, 523, 525, 527, 528

[56] References Cited

U.S. PATENT DOCUMENTS

| | | | |
|---|---|---|---|
| 3,728,620 | 4/1973 | Heins | 324/520 |
| 3,751,606 | 8/1973 | Kaiser, Jr. | 379/26 |
| 3,781,665 | 12/1973 | Gale | 324/533 |
| 3,904,839 | 9/1975 | Peoples | 379/26 |
| 3,978,282 | 8/1976 | Fulton, Jr. | 178/69 G |
| 4,438,389 | 3/1984 | De Sa | 324/523 |
| 4,791,377 | 12/1988 | Grandfield et al. | 327/105 |
| 5,068,614 | 11/1991 | Fields et al. | 324/534 |
| 5,083,086 | 1/1992 | Steiner | 324/533 |
| 5,101,161 | 3/1992 | Walsh et al. | 324/543 |
| 5,172,058 | 12/1992 | Tasca | 324/225 |
| 5,210,498 | 5/1993 | Paananen | 324/529 |
| 5,345,182 | 9/1994 | Wakamatsu | 324/522 X |
| 5,361,029 | 11/1994 | Rider et al. | 324/326 |
| 5,463,317 | 10/1995 | Murphy | 324/520 |
| 5,469,066 | 11/1995 | Ito et al. | 324/551 |
| 5,477,152 | 12/1995 | Hayhurst | 324/542 |
| 5,498,967 | 3/1996 | Bass et al. | 324/543 |

FOREIGN PATENT DOCUMENTS 55-4092  3/1980  Japan .

OTHER PUBLICATIONS

Viles, Roger S., Using a Sweep Generator for Frequency Domain Analysis, Eletronics Australia, pp. 68, 69, 71 and 74., Eletronics Australia, Mar. 1971.

Primary Examiner—Josie Ballato
Assistant Examiner—T. R. Sundaram
Attorney, Agent, or Firm—Beth A. Vrioni; Gary G. Borda

[57] ABSTRACT

A non-intrusive electrical cable tester determines the nature and location of a discontinuity in a cable through application of an oscillating signal to one end of the cable. The frequency of the oscillating signal is varied in increments until a minimum, close to zero voltage is measured at a signal injection point which is indicative of a minimum impedance at that point. The frequency of the test signal at which the minimum impedance occurs is then employed to determine the distance to the discontinuity by employing a formula which relates this distance to the signal frequency and the velocity factor of the cable. A numerically controlled oscillator is provided to generate the oscillating signal, and a microcontroller automatically controls operation of the cable tester to make the desired measurements and display the results. The device is contained in a portable housing which may be hand held to facilitate convenient use of the device in difficult to access locations.

10 Claims, 2 Drawing Sheets

NON-INTRUSIVE IMPEDANCE-BASED CABLE TESTER

ORIGIN OF THE INVENTION

The invention described herein was made in the performance of work under a NASA contract and is subject to the provisions of Section 305 of the National Aeronautics and Space Act of 1958, public law 85-568 (72 STAT. 435; 42 U.S.C. 2457).

BACKGROUND OF THE INVENTION

The present invention relates in general to a method and apparatus for determining the location of a short circuit or an open circuit in an electrical cable, based on impedance measurements made at one end of the cable.

The Space Shuttle uses dedicated signal conditioners (DSCs) for the purpose of conditioning transducer outputs and other signals to make them compatible with orbiter telemetry, displays and data processing systems. The DSCs are located throughout the orbiter, often in difficult to access locations in the vehicle fuselage. When troubleshooting a potential instrumentation problem, personnel frequently have to demate cables to verify that the cables are not the source of the problem. However, once a cable is demated, all DSCs and other systems which have a wire passing through the cable's connector have to be retested after the cable is reconnected. Due to their inaccessibility, the DSCs sometimes have to be removed in order to check them. This results in many man hours of revalidation testing on systems that were unrelated to the original problem. The cost to the Shuttle program for these retesting procedures is exorbitant. A system which allows cable continuity to be checked non-intrusively without demating the cables would therefore save many hours of testing and substantially reduce testing costs.

One known technique for non-intrusively checking cable continuity is time domain reflectometry (TDR). In TDR, a high frequency pulse is injected into one end of the cable. A discontinuity in the cable will cause a reflection of the pulse that can be detected back at the end where the pulse was injected. The location of this discontinuity can be determined by measuring the time interval between when the pulse is injected into the cable, and when the reflected pulse is detected. Also, the polarity of the reflected pulse is indicative of whether the discontinuity is a short circuit or an open circuit.

Unfortunately, TDR is not feasible for detecting cable faults in the Space Shuttle. This is because the faults are typically only a few meters or less from the injection point, and TDR is ineffective at these distances due to the extremely short total travel time (e.g., a few nanoseconds) of the high frequency pulse.

In view of the foregoing, a need therefore exists for a non-intrusive cable testing technique which provides the accuracy necessary for use in the Space Shuttle environment.

SUMMARY OF THE INVENTION

The present invention satisfies the foregoing need through provision of a non-intrusive cable fault detection method and apparatus in which the location of a cable fault can be accurately measured by monitoring the impedance presented by the cable to an injected oscillating signal as the frequency of the signal is varied. When the impedance at the injection point is a minimum, the RMS voltage at that point will also be a minimum. Using the frequency of the applied test signal where the minimum impedance or minimum voltage occurs, the distance along the cable from the test signal injection point to a discontinuity (i.e., open or short circuit) in the cable can be determined by employing a formula which defines the distance as a function of the test signal frequency and other known parameters.

In the preferred embodiment of the invention, a numerically controlled variable frequency oscillator is used to generate a sinusoidal test signal which is applied across a reference resistor to the cable under test. A microcontroller controls operation of the oscillator so that the frequency of the applied signal is swept in increments over a range of frequencies during the testing procedure. The RMS voltage which is generated at the signal injection point in response to the applied test signal is monitored by the microcontroller which analyzes the voltage information to determine the frequency at which the voltage is nearly zero volts, thereby indicating that the reflected signal from the discontinuity is approximately 180° out of phase from the injected signal. This occurs when either an open circuit exists at a distance of approximately ¼ wavelength of the injected signal down the cable from the injection point, or a short circuit exists approximately ½ wavelength down the cable.

The method employed by the apparatus for obtaining the impedance measurements is preferably carried out in the following manner. First, the microcontroller commands the numerically controlled oscillator to output a fixed frequency sine wave. This fixed frequency is chosen so that its wavelength is much larger than the length of the cable under test. A/D converters read the peak voltage amplitudes generated by first and second peak detectors at the oscillator side and the cable side of the reference resistor. If the voltage readings are almost equal, the discontinuity in the cable is determined to be caused by an open circuit. Conversely, if the reading at the cable side of the resistor approaches zero, the discontinuity is determined to be caused by a shorted cable. Next, the microcontroller commands the numerically controlled oscillator to output a sweep signal over a range of frequencies, e.g., 10 KHz to 50 MHz, in increments. The microcontroller, by means of the A/D converter, reads the peak amplitude of the output from the cable side peak detector. Once a minimum, or close to zero, reading is obtained, the microcontroller can use the current test signal frequency to generate a coarse estimate of the distance to the discontinuity.

To increase the accuracy of the distance calculations made by the microcontroller, the preferred embodiment of the present invention employs a multiple stage amplifier for amplifying the output of the cable side peak detector. The outputs of each successive stage of the amplifier thereby provide additional signal resolution. After the coarse estimate of the frequency at which the minimum voltage occurs is calculated by the microcontroller based on the output from the first stage of the amplifier, the microcontroller then commands the numerically controlled oscillator to output a sweep signal in a narrow range of frequencies above and below that frequency, in much smaller increments than were used for the coarse calculation. The microcontroller then reads the peak amplitude from the later stages of the amplifier which will most likely saturate, except when the oscillator outputs the exact frequency where the minimum occurs. This allows the microcontroller to make a more accurate determination of the frequency at which the reflection is approximately 180° out of phase, which in turn allows the microcontroller to more accurately determine the distance from the signal injection point to the discontinuity.

BRIEF DESCRIPTION OF THE DRAWINGS

The features and advantages of the present invention will become apparent from the following detailed description of a preferred embodiment thereof, taken in conjunction with the accompanying drawings in which.

DETAILED DESCRIPTION OF THE PREFERRED EMBODIMENT

Figure 1:
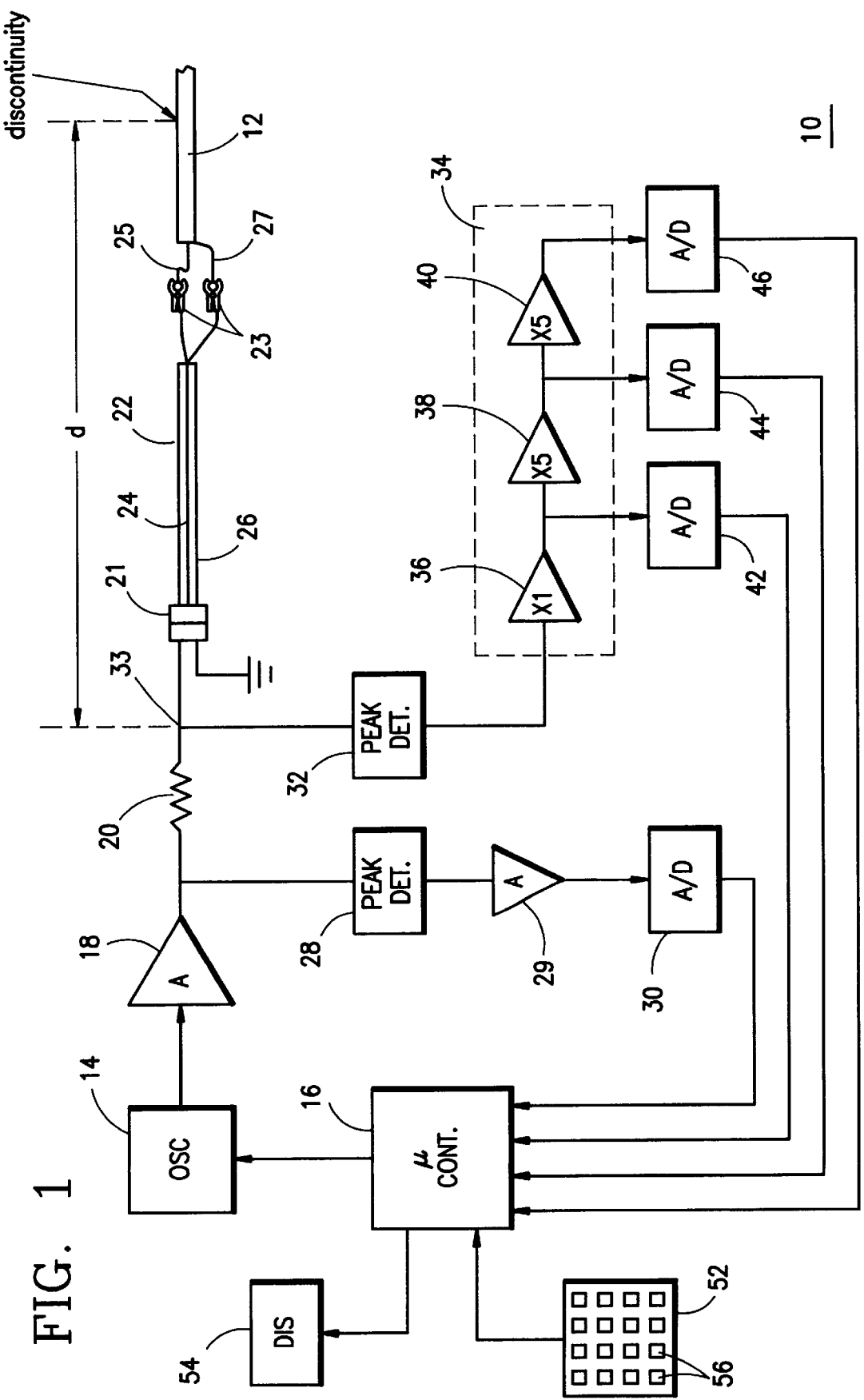
FIG. 1 is a schematic circuit diagram of a non-intrusive cable tester constructed in accordance with a preferred embodiment of the present invention.

With reference to FIG. 1, a cable tester 10 is illustrated for determining the location of a discontinuity, such as a short circuit or an open circuit, in an electrical cable 12. The tester 10 includes a numerically controlled variable frequency oscillator 14 which generates a sinusoidal output signal whose frequency can be varied over a wide range, e.g., 10 KHz to 50 MHz. A microcontroller 16 controls the operation of the oscillator 14, as well as various other elements of the cable tester 10, as discussed in greater detail below.

The output from the oscillator 14 is passed through a first amplifier and driver stage 18 and a reference resistor 20 to an electrical connector 21. A coaxial cable 22 of known length has a first end connected to the electrical connector 21, and a second end connected to a pair of small clip leads 23 for attachment to any suitable connection points (e.g., solder joints) of the cable 12 under test. The coaxial cable 22 includes a center conductor 24 for passing the oscillator test signal to a positive conductor 25 of the cable 12, and a ground or outer conductor 26 for connecting the electrical ground of the cable tester 10 with a ground lead 27 of the cable 12.

A first peak detector 28 senses the RMS voltage at the output of the amplifier and driver stage 18 at a first side of the reference resistor 20, and feeds this through a second amplifier and driver stage 29 to a first A/D converter 30. The A/D converter 30 digitizes the analog voltage measurement generated by the peak detector 28, and passes this digital value to the microcontroller 16. A second peak detector 32 senses the RMS voltage at a signal injection point 33 located at a second side of the resistor 20 connected to the cable 12, and feeds this value through a three-stage amplifier 34.

As will be discussed in greater detail below, the three-stage amplifier 34 is provided to increase resolution of the detected voltage signal for increasing accuracy of the discontinuity location measurement. The three-stage amplifier 34 includes, in series, a first, unity gain stage 36, a second, 5× gain stage 38 and a third, 5× gain stage 40. The analog outputs from each of the three stages 36, 38 and 40 are fed into second, third and fourth A/D converters 42, 44 and 46, respectively, where they are digitized and fed into the microcontroller 16.

Figure 2:
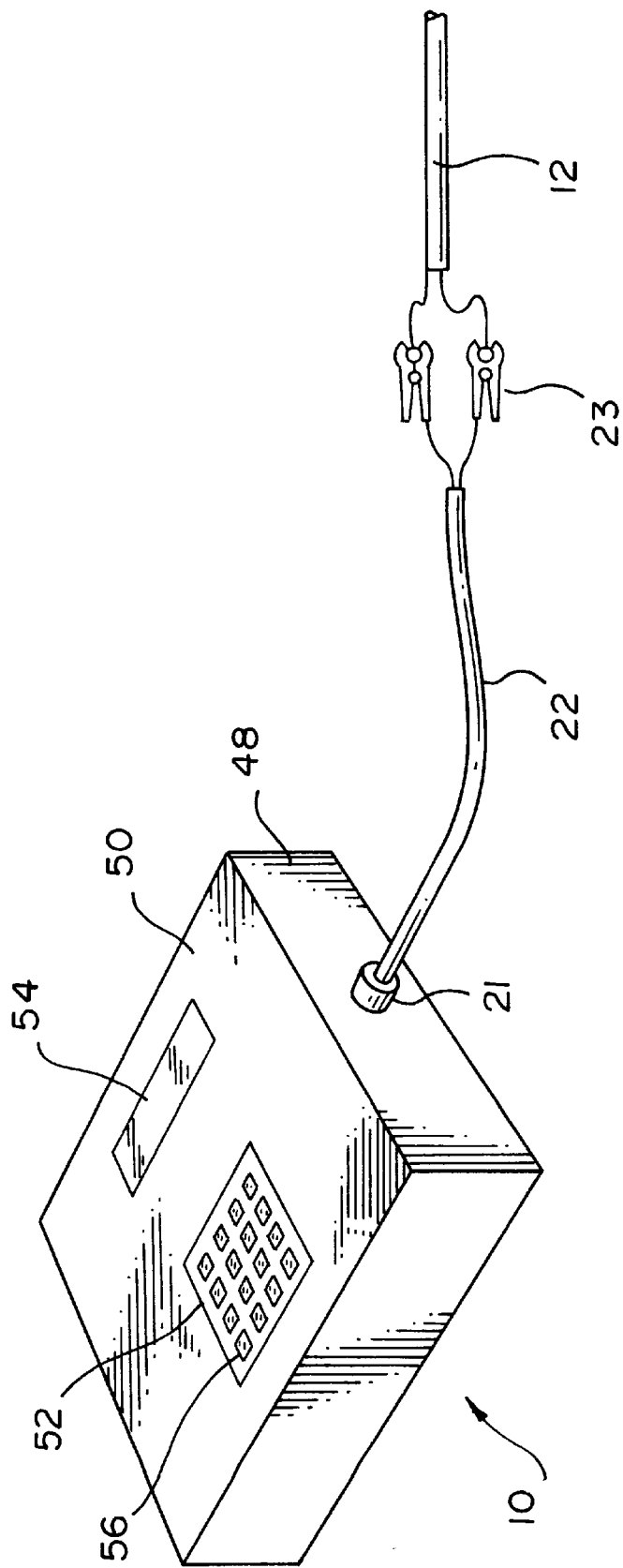
FIG. 2 is an illustration of a portable housing for the cable tester of FIG. 1.

As illustrated in FIG. 2, all of the aforementioned circuit elements of the cable tester 10 are contained within a portable housing 48, which preferably can be hand held. Disposed on a top side 50 of the housing 48 are a keyboard 52 for controlling operation of the cable tester 10, and a display 54 for displaying fault location distance measurements and other parameters. The keyboard 52 includes a number of keys 56 for entering cable tester functions and numerical values. The cable tester functions include a start sweep function for initiating the sweeping of the oscillator frequencies by the microcontroller 16, functions for selecting both the low and high frequency limits of the desired swept frequency range, a function for manually setting the frequency of the oscillator 14, and a function for entering the velocity factor of the cable to be tested. These functions will be discussed in greater detail below.

The theory by which the cable tester 10 operates is as follows. When the sinusoidal wave from the oscillator 14 is injected into the cable 12, the magnitude of the impedance at the injection point 33 can be approximately estimated by using the following equation:

$$Z = RV_0/(V - V_0) \qquad (1),$$

where R is the resistance of the reference resistor 20, V is the RMS voltage sensed by the first peak detector 28 at the output of the first driver amplifier 18, and Vo is the RMS voltage sensed by the second peak detector 32 at the signal injection point 33. Although both the magnitude and the phase of V and Vo must be measured in order to obtain the exact impedance, only the maximum and minimum impedances are required for the present application. More particularly, it is only necessary to detect, through the peak detectors 28 and 32, when V and Vo are almost equal, thereby indicating a maximum impedance, and also when Vo is almost zero, thereby indicating a minimum impedance. Thus, when the test signal is applied to the cable 12, and a reflected signal is in phase with the test signal, V and Vo will be equal since the apparent load impedance is infinite. On the other hand, when the reflected signal is approximately 180° out of phase with the test signal, Vo will be almost zero, since the apparent load impedance is almost zero.

When a minimum impedance occurs at the injection point 33 of the sinusoidal test signal, this is an indication that either an open circuit exists in the cable 12 at a distance from the injection point 33 which may be calculated by the following formula:

$$d = (c/f) \times (vf) \times (\tfrac{1}{4}) \qquad (2);$$

or a short circuit exists in the cable 12 at:

$$d = (c/f) \times (vf) \times (\tfrac{1}{2}) \qquad (3),$$

where d is the distance in meters from the injection point 33 (cable side of the reference resistor 20) to the discontinuity, c is the speed of light (in m/s), f is the frequency in cycles per second of the oscillator 14 where the minimum impedance occurs, and vf is the velocity factor of the cable (usually between 60 and 90%).

It should be noted that d includes the length of the coaxial cable 22 which is employed to connect the cable tester 10 to the cable 12 under test, as well as the short length from the signal injection point 33 to the connector 21. However, since these lengths are known, the actual distance along the cable 12 to the detected discontinuity can be easily obtained by subtracting these two lengths from the distance calculated by the cable tester 10. It should also be noted that although equations (2) and (3) provide an exact distance measurement only if the measured RMS voltage at the injection point 33 is exactly zero, and there are no electrical losses in the cable 12, the connector 21 and the coaxial cable 22, these equations can still provide a very accurate measurement of the distance to a discontinuity when the measured RMS voltage, and therefore impedance, at the signal injection point 33 is at a minimum, close to zero value.

In the operation of the cable tester 10, the user, through the function keys 56, first enters the velocity factor vf of the cable to be tested, and then initiates the frequency sweeping of the oscillator 14 by the microcontroller 16. If desired, the user may also manually select the frequency range of the oscillator to be swept by selecting the lowest and highest frequencies in the range. This feature is useful in situations where a user has a general idea of the location of a discontinuity in the cable 12, and wants to limit the swept frequency range accordingly to accelerate the fault location detection process.

Before the microcontroller 16 initiates the frequency sweeping of the oscillator 14, the microcontroller 16 causes the oscillator 14 to apply a fixed frequency, e.g., 1 KHz, sine wave to the cable 12, the fixed frequency being chosen to have a wavelength which is much larger than the length of the cable 12 under test. The microcontroller 16 then compares the RMS voltages V and Vo on either side of the reference resistor 20 by reading the outputs from the first and second A/D converters 30 and 42. If the readings are almost equal, the detected discontinuity in the cable 12 is determined to be caused by an open circuit. On the other hand, if the RMS voltage Vo at the cable side of the resistor 20 approaches zero, the discontinuity is determined by the microcontroller 16 to be caused by a short circuit along the cable 12.

Next, the microcontroller 16 commands the oscillator 14 to output a sweep signal through the selected frequency range in predetermined increments, e.g., 50 KHz. At each increment, the microcontroller 16 reads the peak amplitude of Vo by measuring the output from the second A/D converter 42. Once a minimum reading is obtained, the test signal frequency at which this occurs is noted by the microcontroller 16.

Although a coarse estimate of the distance to the discontinuity can be calculated from the noted test signal frequency by using equation (2) or (3), the accuracy of this reading is limited by the resolution of the second A/D converter 42 which is used to digitize the voltage Vo. For example, an 8-bit A/D converter has, in a 0–5 volt range, approximately a 25 mV resolution. This amount of resolution is not enough to enable the microcontroller 16 to detect differences between an in-phase reflection and a reflection a few degrees out of phase. Such an error could translate into an uncertainty exceeding 5% of the distance to the discontinuity.

Thus, to improve the accuracy of the reading generated by the cable tester 10, the second and third stages 38 and 40 of the three-stage amplifier 34 are employed once the microcontroller 16 has made the coarse frequency measurement. At this time, the microcontroller 16 commands the oscillator 14 to output a sweep signal in smaller increments, e.g., 1–4 KHz, ranging from approximately 200 KHz below the frequency where the first detected minimum voltage, and therefore impedance, occurred, up to 200 KHz above that frequency. For each increment, the outputs from the second and third stages 38 and 40 of the amplifier 34 are monitored by means of the third and fourth A/D converters 44 and 46. Until the oscillator 14 outputs the exact frequency where Vo is at a second, lower minimum value closest to zero volts, the outputs from the second and third stages 38 and 40 will most likely saturate. However, once the oscillator 14 is adjusted to a frequency which results in Vo being almost zero volts, the outputs from one or both of the second and third stages 38 and 40 will be below the saturation level. In this manner, the microcontroller 16 can more accurately determine the frequency at which the reflection is essentially 180° out of phase, and Vo is essentially zero. The increased resolution values generated by the third and fourth A/D converters 44 and 46 thereby provide the microcontroller 16 with the ability to determine the distance to a discontinuity along the cable 12 within an increased accuracy in the range of approximately 1 cm or less.

Once the frequency at which Vo, and therefore the impedance, at the signal injection point 33 reaches a minimum is obtained, the microcontroller 16 determines the distance in meters to the discontinuity using the entered velocity factor and the appropriate one of equations (2) or (3). This value is then supplied to the display 52 along with an indication of whether the detected discontinuity is an open or a short circuit.

In view of the foregoing, it will be understood that the cable tester 10 can quickly provide an accurate indication of the nature of, and distance to, a discontinuity in an electrical cable, without requiring removal of the cable from the circuitry to which it is connected. This is achieved with a simple design which results in the cable tester being substantially cheaper to manufacture than a typical TDR based device, for example. The convenience of the cable tester is further enhanced by its portability, automatic operation, ability to accommodate different cable velocity factors, and provision of a manually selectable frequency sweep range.

Although the invention has been disclosed in terms of a preferred embodiment, it will be understood that numerous variations and modifications could be made thereto without departing from the scope of the invention as defined in the following claims.

What is claimed is:

1. An apparatus for determining the location of a discontinuity in an electrical cable comprising:

a) a variable frequency oscillator for applying a variable frequency oscillating test signal to a signal injection point at one end of an electrical cable under test;

b) a reference resistor disposed between said oscillator and said signal injection point; and c) a microcontroller for controlling operation of said oscillator, said microcontroller including means for determining a frequency of said test signal at which an electrical impedance at said signal injection point between said oscillator and said cable is a minimum, and determining from said frequency, the distance from said injection point to a discontinuity in said cable, said microcontroller further including means for comparing a voltage magnitude at said signal injection point to a voltage magnitude at an oscillator side of said reference resistor, and determining that said discontinuity is: 1) an open circuit if said voltages are approximately equal to one another, and 2) a short circuit if said signal injection point voltage is approximately zero volts.

2. The apparatus of claim 1, further comprising:

d) a peak detector disposed between said signal injection point and said microcontroller for supplying a peak voltage measurement at said injection point to said microcontroller for enabling said microcontroller to determine the impedance at said injection point.

3. The apparatus of claim 2, further comprising:

e) an amplifier connected to an output of said peak detector for generating an amplified signal; and f) an A/D converter connected to said amplifier output for converting said amplified signal into a digital value and supplying said digital value to said microcontroller.

4. The apparatus of claim 3, wherein said amplifier further comprises a three stage amplifier with first, second and third series connected amplifier stages, each generating an output; and said A/D converter further comprises first, second and third A/D converters, each receiving a corresponding one of said outputs from said first, second and third stages.

5. The apparatus of claim 1, further comprising:
d) a display connected to said microcontroller for displaying calculated distance measurements; and
e) a keyboard connected to said microcontroller for entering control functions.

6. The apparatus of claim 5, further comprising:
f) a portable housing for containing said oscillator and said microcontroller.

7. The apparatus of claim 6, further comprising:
g) a coaxial cable of a predetermined length connected to an output of said oscillator for electrically connecting said oscillator to said cable under test.

8. A method for determining the location of a discontinuity in an electrical cable comprising the steps of:
a) applying an oscillating electrical signal through a reference resistor to a first end of said cable;
b) comparing an electrical voltage on a first side of said resistor to an electrical voltage on a second side of said resistor connected to said cable;
c) determining that an open circuit discontinuity is present in said cable if said voltages are approximately equal, and determining that a short circuit discontinuity is present in said cable if said voltage at said second side of said resistor is approximately zero volts;
d) varying a frequency of said oscillating signal until the electrical impedance at a signal injection point of said signal located at said second side of said resistor is a minimum value; and
e) determining the distance from said signal injection point to said discontinuity along said cable from the frequency at which said impedance is a minimum value.

9. The method of claim 8, wherein said step of varying said frequency further comprises:
1) varying said frequency in predetermined increments until said detected impedance is a first minimum value, and noting a first frequency at which this occurs; and
2) varying said frequency of said oscillating signal in smaller increments above and below said first frequency to determine a second frequency at which said impedance is a second lower minimum value.

10. The method of claim 8, wherein said step of determining further comprises determining the distance to said discontinuity from the formula $d=(c/f)\times(vf)\times(\frac{1}{4})$ if said detected discontinuity is an open circuit, and determining the distance to said discontinuity using the formula $d=(c/f)\times(vf)\times(\frac{1}{2})$ if the detected discontinuity is a short circuit, where d is the distance in meters from the signal injection point to said discontinuity, c is the speed of light in meters per second, f is the frequency in cycles per second of said test signal at which said minimum impedance occurs, and vf is a velocity factor of said cable.

* * * * *